United States Patent
Huang

(10) Patent No.: US 10,728,472 B2
(45) Date of Patent: Jul. 28, 2020

(54) IMAGE SENSOR WITH DYNAMIC CHARGE-DOMAIN SAMPLING

(71) Applicant: SHENZHEN GOODIX TECHNOLOGY CO., LTD., Guangdong (CN)

(72) Inventor: Hsin Yuan Huang, Taipei (TW)

(73) Assignee: SHENZHEN GOODIX TECHNOLOGY CO., LTD, Guangdong (CN)

( * ) Notice: Subject to any disclaimer, the term of this patent is extended or adjusted under 35 U.S.C. 154(b) by 0 days.

(21) Appl. No.: 16/371,532

(22) Filed: Apr. 1, 2019

(65) Prior Publication Data

US 2020/0112697 A1  Apr. 9, 2020

Related U.S. Application Data

(60) Provisional application No. 62/743,246, filed on Oct. 9, 2018.

(51) Int. Cl.
*H04N 5/351* (2011.01)
*H01L 27/146* (2006.01)
*H04N 5/3745* (2011.01)

(52) U.S. Cl.
CPC ....... *H04N 5/351* (2013.01); *H01L 27/14605* (2013.01); *H01L 27/14612* (2013.01); *H01L 27/14643* (2013.01); *H04N 5/3745* (2013.01)

(58) Field of Classification Search
CPC .......... H04N 5/351; H04N 5/3745; H04N 5/374–37457; H01L 27/14612; H01L 27/14605; H01L 27/14643–14663

(Continued)

(56) References Cited

U.S. PATENT DOCUMENTS 7,286,174 B1  10/2007  Weale et al.
7,652,704 B2 *  1/2010  Mauritzson ............ H04N 3/155
                                                              348/308

(Continued)

FOREIGN PATENT DOCUMENTS

CN       108305884       7/2018

OTHER PUBLICATIONS

"Technical Papers from Int. Image Sensor Workshop 2017." An 87dB Single Exposure Dynamic Range CMOS Image Sensor with a 3.0µm Triple Conversion Gain Pixel: Photographic Science and Technology Forum: Digital Photography Review, www.dpreview.com/forums/post/60118238.

(Continued)

*Primary Examiner* — Lin Ye
*Assistant Examiner* — Chan T Nguyen
(74) *Attorney, Agent, or Firm* — WPAT, P.C., Intellectual Property Attorneys; Anthony King

(57) ABSTRACT

An image sensor is disclosed. The image sensor includes: a pixel coupled to a floating diffusion region; a reset select transistor coupled between the floating diffusion region and a first supply voltage; an n-type source follower transistor coupled between the first supply voltage and a second supply voltage, the n-type source follower being operable to receive electrical signal from the floating diffusion region; an n-type row select transistor coupled between the first supply voltage and the n-type source follower transistor; a first sample-and-hold capacitor coupled between a third supply voltage and the second supply voltage; a first switch coupled between the n-type row select transistor and the first sample-and-hold capacitor; and a second switch coupled between the third supply voltage and the first sample-and-hold capacitor.

20 Claims, 4 Drawing Sheets

(58) Field of Classification Search
USPC .......................................................... 348/294
See application file for complete search history.

(56) References Cited

U.S. PATENT DOCUMENTS

| | | | | |
|---|---|---|---|---|
| 7,812,874 | B2* | 10/2010 | Iwabuchi | H01L 27/14603 348/294 |
| 10,171,761 | B2* | 1/2019 | Hanzawa | H04N 5/359 |
| 10,181,492 | B2* | 1/2019 | Ihara | H01L 27/1464 |
| 2004/0135064 | A1* | 7/2004 | Mabuchi | H04N 5/35527 250/208.1 |
| 2007/0235631 | A1* | 10/2007 | Ladd | H04N 5/3575 250/208.1 |
| 2008/0204567 | A1 | 8/2008 | Xu | |
| 2009/0213259 | A1 | 8/2009 | Su et al. | |
| 2009/0272879 | A1* | 11/2009 | Dai | H04N 5/3559 250/208.1 |
| 2010/0265079 | A1* | 10/2010 | Yin | H04N 5/35545 340/635 |
| 2012/0013486 | A1* | 1/2012 | Chao | G01B 11/002 341/13 |
| 2012/0256077 | A1* | 10/2012 | Yen | H01L 27/14609 250/208.1 |
| 2013/0107093 | A1 | 5/2013 | Aoki | |
| 2013/0229560 | A1 | 9/2013 | Kondo | |
| 2014/0327802 | A1* | 11/2014 | Mabuchi | H04N 5/3559 348/308 |
| 2016/0165159 | A1* | 6/2016 | Hseih | H04N 5/23235 348/273 |
| 2017/0148832 | A1 | 5/2017 | Yamashita | |
| 2018/0198997 | A1* | 7/2018 | Otaka | H04N 5/3575 |
| 2018/0227516 | A1 | 8/2018 | Mo et al. | |

OTHER PUBLICATIONS

English abstract translation of CN108305884.

* cited by examiner

IMAGE SENSOR WITH DYNAMIC CHARGE-DOMAIN SAMPLING

CROSS REFERENCE TO RELATED APPLICATIONS

This application claims the benefit of U.S. provisional application 62/743,246, filed on Oct. 9, 2018, which is incorporated by reference in its entirety.

TECHNICAL FIELD

The present disclosure relates to an image sensor and, more particularly, to an image sensor with dynamic charge-domain sampling.

BACKGROUND

CMOS image sensor with adjustable sensitivity is wildly adopted to control pixel conversion gain (CG) with respect to light intensity. High light intensity requires low conversion gain to avoid saturation. Low light intensity requires high conversion gain so signal can be read out with shorter charge transfer time. However, conventional CMOS image sensor with adjustable sensitivity consumes extra hardware for adjusting capacitance of the charge storage node. The extra hardware causes the fill factor to be reduced and a dilemma arises.

SUMMARY OF THE INVENTION

Therefore, a main object of some embodiments of the present disclosure is to provide an image sensor with dynamic charge-domain sampling to solve the above mentioned issues.

Some embodiments of the present disclosure provide an image sensor. The image sensor includes a pixel coupled to a floating diffusion region; a reset select transistor coupled between the floating diffusion region and a first supply voltage; an n-type source follower transistor coupled between the first supply voltage and a second supply voltage, the n-type source follower being operable to receive electrical signal from the floating diffusion region; an n-type row select transistor coupled between the first supply voltage and the n-type source follower transistor; a first sample-and-hold capacitor coupled between a third supply voltage and the second supply voltage; a first switch coupled between the n-type row select transistor and the first sample-and-hold capacitor; and a second switch coupled between the third supply voltage and the first sample-and-hold capacitor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION

Figure 1:
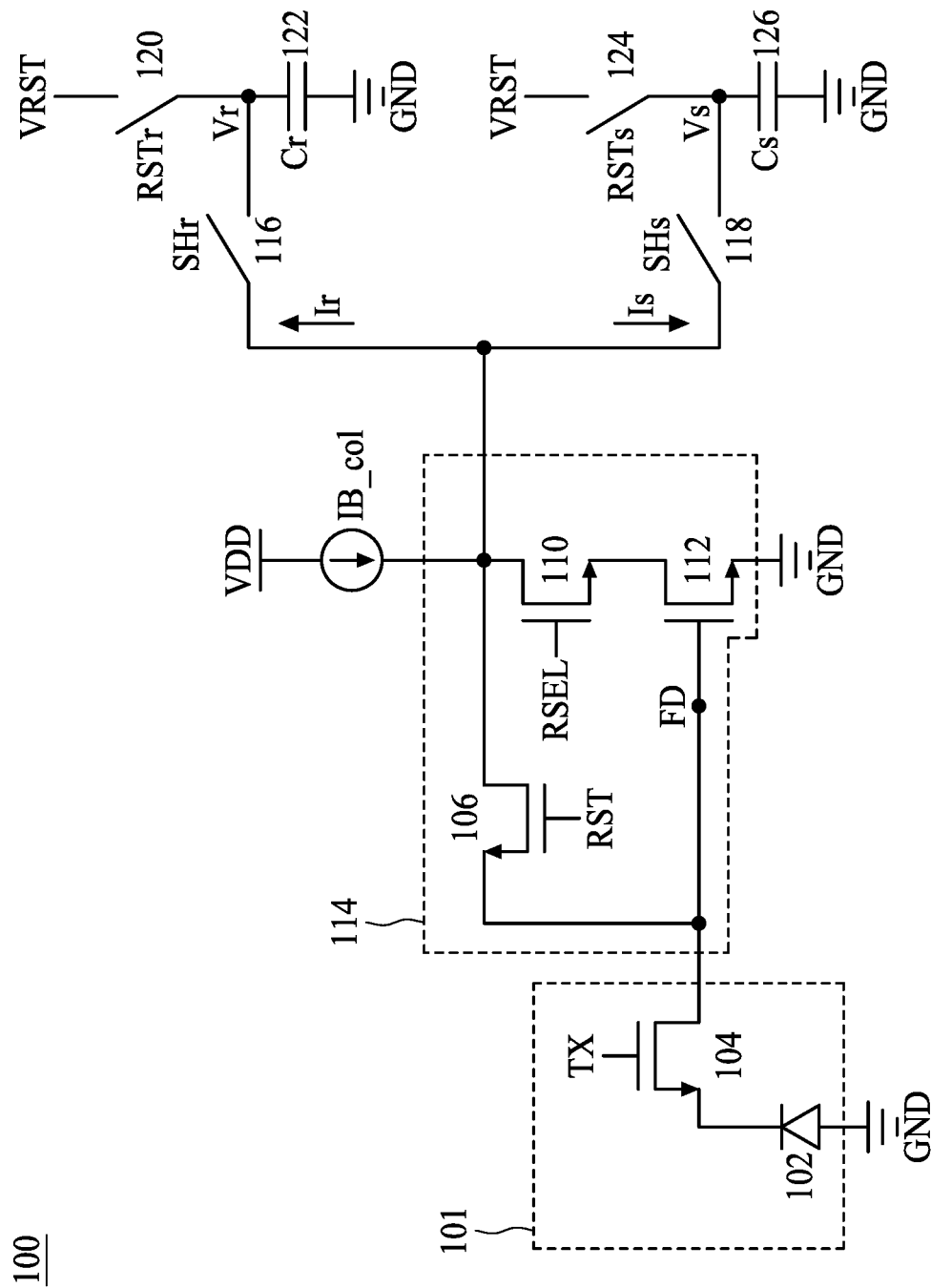
FIG. 1 is a diagram illustrating an image sensor with dynamic charge-domain sampling according to a first embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Existing four-transistor ("4T") pixels are normally gain-fixed at its voltage output node. In other words, it is unable to adjust the photoelectric conversion gain to enhance the detection sensitivity in the pixel according to intensity of incident light. The present disclosure provides architectures based on a charge-sampling pixel featuring in-pixel amplification. Compared to a fixed-gain in-pixel amplifier, the charge-sampling pixel converts an FD node voltage into a current by a pixel output voltage gain to a following integrator with a variable time window and/or variable capacitance. By dynamically controlling the time window and/or capacitance according to the incident light level, the proposed architectures overcome the trade-off between input-referred noise, which benefits from high gain, and dynamic range (DR), which benefits from low gain.

FIG. 1 is a diagram illustrating an image sensor 100 with dynamic charge-domain sampling according to a first embodiment of the present disclosure. The image sensor 100 includes a pixel 101 followed by a transconductance (Gm) cell 114, which, together with a first sample-and-hold (S/H) capacitor 126 and a second S/H capacitor 122, act like a Gm-C integrator. The pixel 101 includes a single photodiode 102 and a transfer transistor 104 for gating between the photodiode 102 and a floating diffusion (FD) node through the control of a signal TX. The transfer transistor 104 is an n-type metal-oxide-semiconductor (NMOS) transistor.

In particular, the Gm cell 114 includes a reset select transistor 106, a row select transistor 110 and a source follower transistor 112. The reset select transistor 106, the row select transistor 110 and the source follower transistor 112 are NMOS transistors. The reset select transistor 106 is coupled between the floating diffusion node FD and a first supply voltage VDD. In some embodiments, a drain of the reset select transistor 106 is directly connected to a drain of the row select transistor 110. A signal RST is configured for controlling gating of the reset select transistor 106. The source follower transistor 112 is coupled between the first supply voltage VDD and a second supply voltage GND, i.e. a ground voltage. The first supply voltage is greater than the second supply voltage. However, the second supply voltage is not limited to the ground voltage. A gate of the source follower 112 is coupled to the floating diffusion node FD, so that the source follower 112 is operable to receive electrical signal from the floating diffusion node FD. The row select transistor 110 is coupled between the first supply voltage VDD and the source follower transistor 112. In some embodiments, a source of the row select transistor 110 is directly connected to a drain of the source follower 112. A signal RSEL is configured for controlling gating of the row select transistor 110. The first sample-and-hold capacitor 126 is configured for storing charge at a signal level integration. The first sample-and-hold capacitor 126 is coupled between a third supply voltage VRST and the second supply voltage GND. In particular, a bottom plate of the first sample-and-hold capacitor 126 is coupled to the second supply voltage GND. A second switch 124 is coupled between the third supply voltage VRST and a top plate of the first sample-and-hold capacitor 126. The second switch 124 is controlled by a signal RSTs. One end of a first switch 118 is coupled to the drain of the row select transistor 110, a source of the reset select transistor 106 and the first supply voltage VDD. The other end of the first switch 118 is coupled to the top plate of the first sample-and-hold capacitor 126. The first switch 118 is controlled by a signal SHs. The signal SHs provides a time window for the signal level integration. In some embodiments, the signal SHs is programmable according to the incident light level. For example, high light level requires low conversion gain to avoid saturation. Low light level requires high conversion gain so signal can be read out with shorter charge transfer time. By programming the signal SHs, effective dynamic range of the pixel 101 can be achieved without consuming extra hardware area. Also, signal to noise ratio can be improved at the same time.

However, this is not a limitation of the present disclosure. In some embodiments, the time window of the signal SHs is fixed and the first sample-and-hold capacitor 126 may be an adjustable capacitor. Capacitance Cs of the first sample-and-hold capacitor 126 may be dynamically adjusted according to the incident light level. In some embodiments, the signal SHs and the first sample-and-hold capacitor 126 are both adjustable. In this way, the flexibility of the dynamic range can be further extended.

The second sample-and-hold capacitor 122 is configured for storing charge at a reset level integration. The second sample-and-hold capacitor 122 is coupled between a third supply voltage VRST and the second supply voltage GND. In particular, a bottom plate of the second sample-and-hold capacitor 122 is coupled to the second supply voltage GND. A fourth switch 120 is coupled between the third supply voltage VRST and a top plate of the second sample-and-hold capacitor 122. The fourth switch 120 is controlled by a signal RSTr. One end of a third switch 116 is coupled to the drain of the row select transistor 110, the drain of the reset select transistor 106 and the first supply voltage VDD. The other end of the third switch 116 is coupled to the top plate of second first sample-and-hold capacitor 122. The third switch 116 is controlled by a signal SHr. The signal SHr provides a time window for the reset level integration. In some embodiments, the signal SHr is programmable according to the incident light level. However, this is not a limitation of the present disclosure. In some embodiments, the time window of the signal SHr is fixed and the second sample-and-hold capacitor 122 may be an adjustable capacitor. Capacitance Cr of the second sample-and-hold capacitor 122 may be dynamically adjusted according to the incident light level. In some embodiments, the signal SHr and the second sample-and-hold capacitor 122 are both adjustable.

Instead of using a source follower to buffer the voltage from the FD node onto the first and second S/H capacitors 126 and 122, the proposed architecture first converts an FD node voltage VFD into a current $I=G_m$ VFD, where $G_m$ is the trans-conductance of the Gm cell 114. This current is then integrated on the first S/H capacitor 126 with capacitance Cs and the second S/H capacitor 122 with capacitance Cr at the signal level integration and the reset level integration respectively. The integration is dynamically taken place during a programmable time window and/or through an adjustable capacitor, at the end of which the resulting voltage can be sampled. This process is often referred to as dynamic charge-domain sampling. It effectively amplifies the voltage on the FD node with a dynamic gain $A_{pix}=G_m Ts/Cs$ or $G_m Ts/Cr$. The first switch 118, the second switch 124, the third switch 116 and the fourth switch 120 may be NMOS transistors. In some embodiments, the second sample-and-hold capacitor 122, the third switch 116 and fourth switch 120 may be omitted, and therefore the reset level integration can be omitted.

Please note that all the transistors in the image sensor 100 of FIG. 1 are NMOS transistors. Because PMOS transistors need extra N-wells which normally have a more strict design rule comparing to the NMOS transistors, the charge-sampling pixel fully implemented by NMOS transistors is able to have a greater fill factor. It is as well more compatible with current major CIS process, and manufacturing cost can be reduced.

Figure 2:
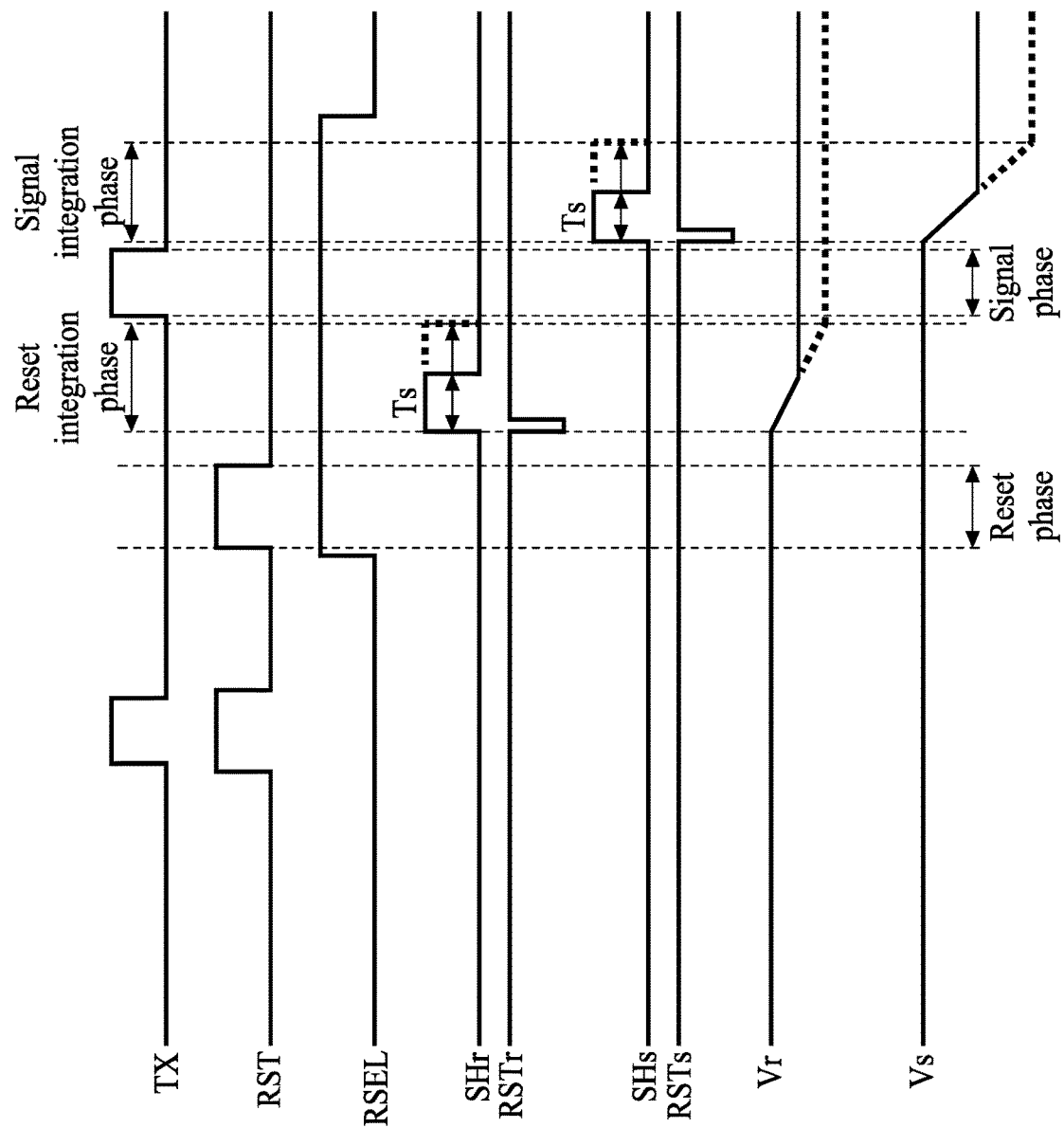
FIG. 2 is a timing diagram illustrating the operation of the image sensor of FIG. 1 according to an embodiment of the present disclosure.

FIG. 2 is a timing diagram illustrating the operation of the image sensor 100 of FIG. 1 according to an embodiment of the present disclosure. During a reset phase as shown in FIG. 2, with the help of a column-wise shared current source IB_col, the reset level at the FD node and the DC operating point of the source follower 112 are defined in a self-biased manner by switching on the reset select transistor 106 through the signal RST. After that, the Gm-cell 114 is configured as an open-loop amplifier by switching off the reset select transistor 106. It then produces a current Ir proportional to the reset level at a reset integration phase before the charge transfer from the photodiode 102 to the FD node. By controlling the third switch 116 and the fourth switch 120, the current Ir charge the capacitor 122 during a programmable period Ts at the reset integration phase to a reset voltage Vr.

After the reset integration phase, the charge is transfer from the photodiode 102 to the FD node through the transfer transistor 104 by asserting the signal TX. It then produces a current Is proportional to the signal level at a signal integration phase. By controlling the first switch 118 and and the second switch 124, the current Is charge the capacitor 126 during the programmable period Ts at the signal integration phase to a signal voltage Vs. After the signal integration phase, a period controlled amplified pixel signal is obtained as Vs-Vr.

Figure 3:
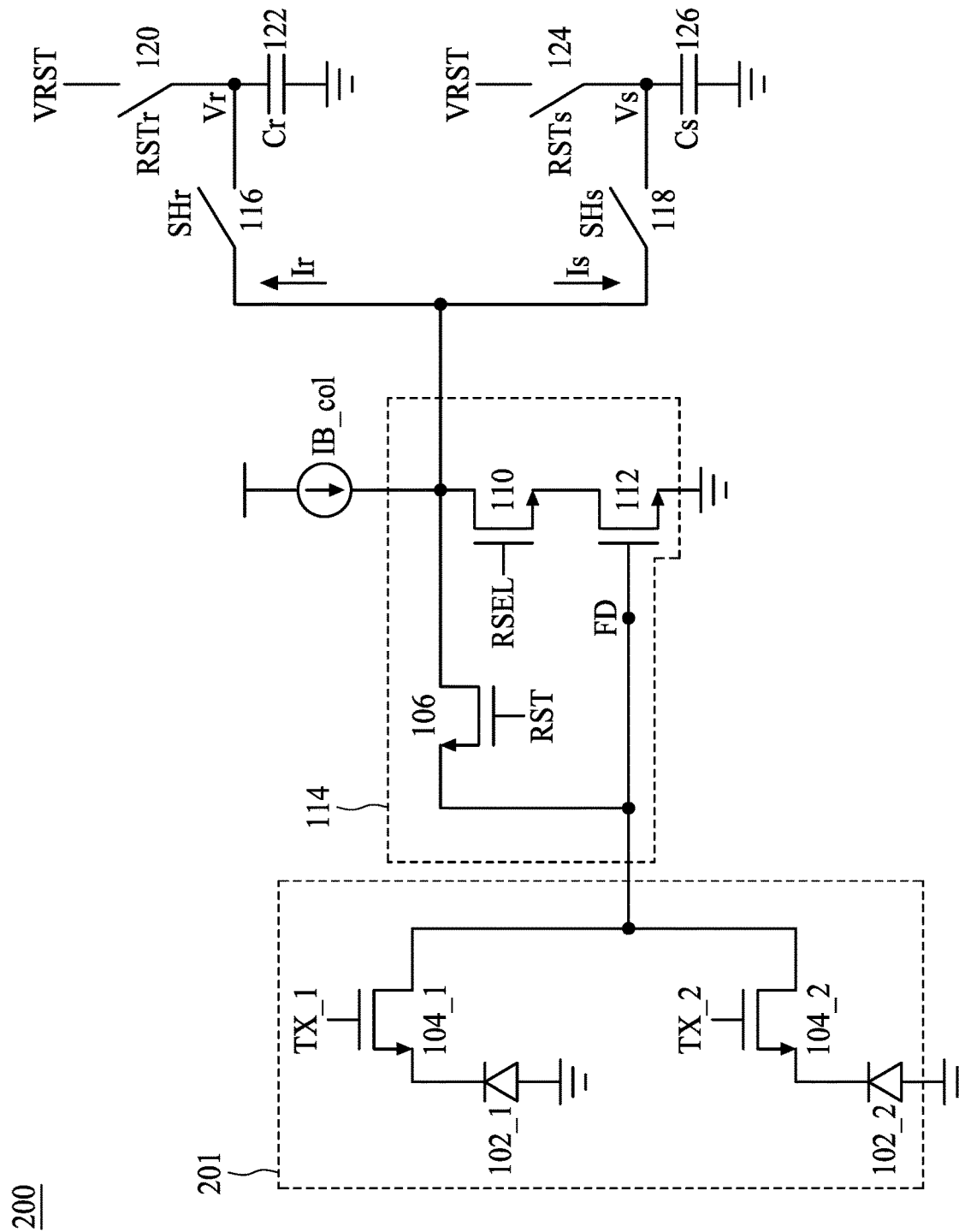
FIG. 3 is a diagram illustrating an image sensor with dynamic charge-domain sampling according to a second embodiment of the present disclosure.
Figure 4:
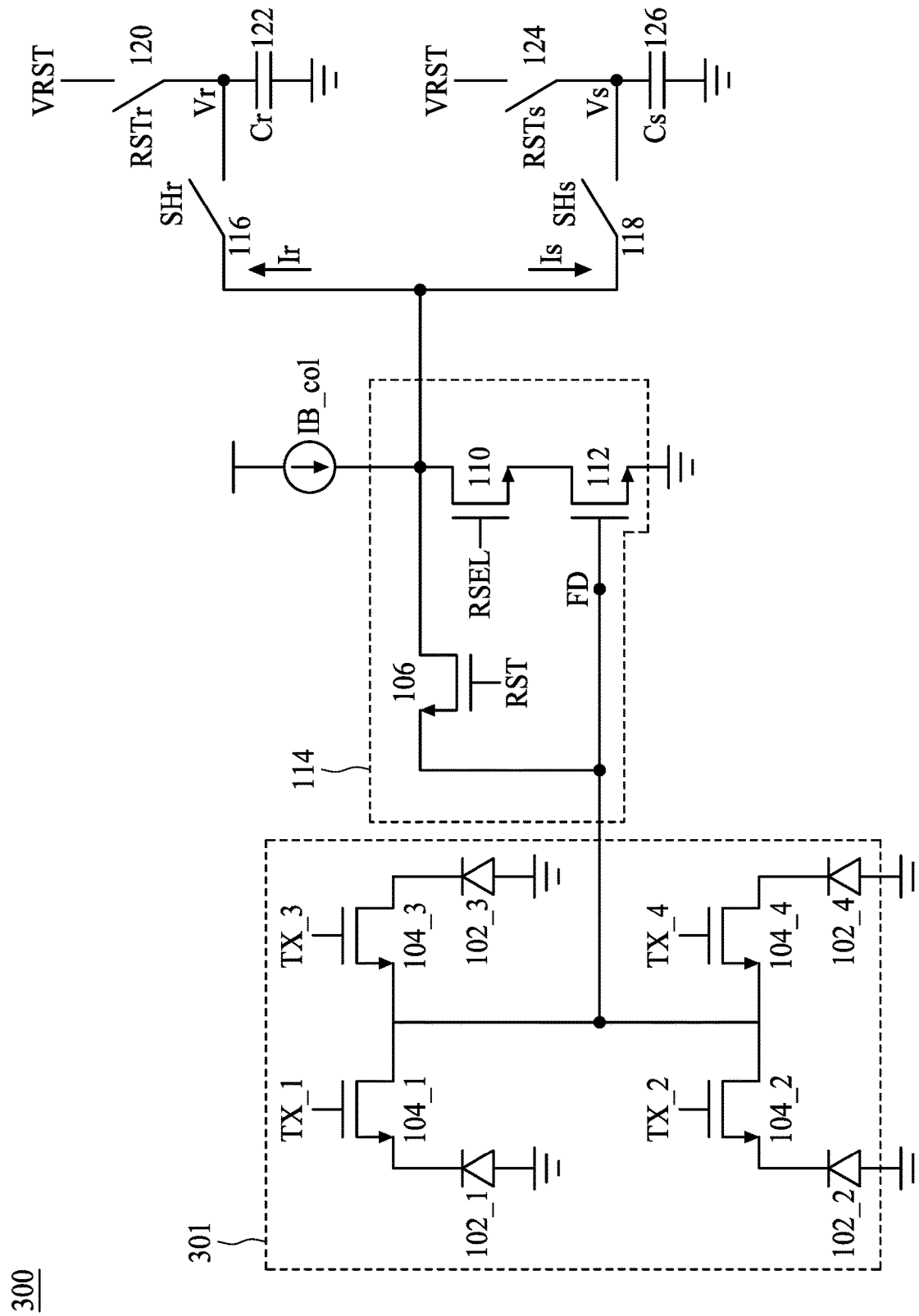
FIG. 4 is a diagram illustrating an image sensor with dynamic charge-domain sampling according to a third embodiment of the present disclosure.

In some embodiments, other type of pixel structure should also be within the contemplated scope of the present disclosure. As a non-limiting example, FIG. 3 is a diagram illustrating an image sensor 200 dynamically integrating a pixel output voltage gain according to a second embodiment of the present disclosure. FIG. 3 is similar to FIG. 1 except the pixel 201 of FIG. 3 is of a two-shared pixel structure. As a non-limiting example, FIG. 4 is a diagram illustrating an image sensor 300 dynamically integrating a pixel output voltage gain according to a third embodiment of the present disclosure. FIG. 4 is similar to FIG. 1 except the pixel 301 of FIG. 4 is of a four-shared pixel structure. The charge-domain sampling functions of FIG. 1, FIG. 2 and FIG. 3 are substantially the same.

Some embodiments of the present disclosure provide an image sensor is disclosed. The image sensor includes: a pixel coupled to a floating diffusion region; a reset select transistor coupled between the floating diffusion region and a first supply voltage; an n-type source follower transistor coupled between the first supply voltage and a second supply voltage, the n-type source follower being operable to receive electrical signal from the floating diffusion region; an n-type row select transistor coupled between the first supply voltage and the n-type source follower transistor; a first sample-and-hold capacitor coupled between a third supply voltage and the second supply voltage; a first switch coupled between the n-type row select transistor and the first sample-and-hold capacitor; and a second switch coupled between the third supply voltage and the first sample-and-hold capacitor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
    a pixel coupled to a floating diffusion region;
    a reset select transistor coupled between the floating diffusion region and a first supply voltage;
    an n-type source follower transistor coupled between the first supply voltage and a second supply voltage, the n-type source follower being operable to receive electrical signal from the floating diffusion region;
    an n-type row select transistor coupled between the first supply voltage and the n-type source follower transistor, wherein a drain of the reset select transistor is directly connected to a drain of the n-type row select transistor;
    a first sample-and-hold capacitor coupled between a third supply voltage and the second supply voltage;
    a first switch coupled between the n-type row select transistor and the first sample-and-hold capacitor; and
    a second switch coupled between the third supply voltage and the first sample-and-hold capacitor.

2. The image sensor of claim 1, wherein the pixel includes a photodiode and a transfer transistor for gating between the photodiode and the floating diffusion region.

3. The image sensor of claim 1, wherein the pixel includes a plurality of photodiodes and a plurality of transfer transistors coupled between the plurality of photodiodes and the floating diffusion region respectively for gating between the plurality of photodiodes and the floating diffusion region respectively.

4. The image sensor of claim 3, wherein the pixel is a two-shared pixel including two photodiodes.

5. The image sensor of claim 3, wherein the pixel is a four-shared pixel including four photodiodes.

6. The image sensor of claim 1, wherein the reset select transistor is an n-type transistor.

7. The image sensor of claim 1, further comprising:
    a second sample-and-hold capacitor coupled between the third supply voltage and the second supply voltage;
    a third switch coupled between the n-type row select transistor and the seocnd sample-and-hold capacitor; and
    a fourth switch coupled between the third supply voltage and the second sample-and-hold capacitor.

8. The image sensor of claim 7, wherein the third switch is an n-type transistor.

9. The image sensor of claim 7, wherein the fourth switch is an n-type transistor.

10. The image sensor of claim 7, wherein a capacitance of the first sample-and-hold capacitor is the same as a capacitance of the second sample-and-hold capacitor.

11. The image sensor of claim 7, wherein a capacitance of the second sample-and-hold capacitor is adjustable.

12. The image sensor of claim 11, wherein the capacitance of the second sample-and-hold capacitor is configured according to a light level of incident light of the pixel.

13. The image sensor of claim 1, wherein the first supply voltage is greater than the second supply voltage.

14. The image sensor of claim 13, wherein the second supply voltage is a ground voltage.

15. The image sensor of claim 1, further comprising a capacitor coupled to the floating diffusion region.

16. The image sensor of claim 15, wherein the capacitor is coupled between the floating diffusion region and the second supply voltage.

17. The image sensor of claim 1, wherein the first switch is an n-type transistor.

18. The image sensor of claim 1, wherein the second switch is an n-type transistor.

19. The image sensor of claim 1, wherein a capacitance of the first sample-and-hold capacitor is adjustable.

20. The image sensor of claim 19, wherein the capacitance of the first sample-and-hold capacitor is configured according to a light level of incident light of the pixel.

* * * * *